United States Patent
Mokhtari et al.

(10) Patent No.: US 7,196,649 B2
(45) Date of Patent: Mar. 27, 2007

(54) REPROGRAMMABLE DISTRIBUTED REFERENCE LADDER FOR ANALOG-TO-DIGITAL CONVERTERS

(75) Inventors: Mehran Mokhtari, Thousand Oaks, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/772,113

(22) Filed: Feb. 3, 2004

(65) Prior Publication Data
US 2005/0168370 A1    Aug. 4, 2005

(51) Int. Cl.
*H03M 1/12* (2006.01)
(52) U.S. Cl. .................................................. 341/155
(58) Field of Classification Search ................ 341/155, 341/160, 135, 136, 138
See application file for complete search history.

(56) References Cited

U.S. PATENT DOCUMENTS

| | | | | |
|---|---|---|---|---|
| 5,623,265 A | * | 4/1997 | Pawar et al. | 341/160 |
| 5,831,567 A | * | 11/1998 | Seki et al. | 341/155 |
| 6,281,828 B1 | * | 8/2001 | Kimura et al. | 341/155 |
| 6,384,757 B1 | * | 5/2002 | Kosonen | 341/120 |
| 6,703,960 B2 | * | 3/2004 | Kressin | 341/159 |
| 2004/0240278 A1 | * | 12/2004 | Brady et al. | 365/189.09 |

* cited by examiner

*Primary Examiner*—Peguy JeanPierre
(74) *Attorney, Agent, or Firm*—Ladas & Parry LLP

(57) ABSTRACT

An analog to digital converter comprises a plurality of comparators, each comparator for comparing an input electrical signal with a respective, pre-selected reference electrical signal, an encoder coupled to the comparators to receive a detection signal from each comparator indicative of the input signal, and a plurality of reference circuits, each reference circuit coupled to a respective one of the plurality of comparators to supply the respective reference electrical signal to the respective comparator.

7 Claims, 6 Drawing Sheets

REPROGRAMMABLE DISTRIBUTED REFERENCE LADDER FOR ANALOG-TO-DIGITAL CONVERTERS

STATEMENT OF GOVERNMENT INTEREST

This invention was made with government support under Contract No. F3060-99-C-0022 awarded by the Air Force Research Laboratory. The government has certain rights in this invention.

BACKGROUND

This invention relates to digital to analog converters (ADCs), and more particularly to a distributed resistor ladder structure for use with flash ADCs.

ADCs are typically utilized to sample an analog electronic signal at a point in time and convert it to a digitized representation thereof. The ADC, in one common configuration, typically includes a resistive ladder network electrically coupled to a plurality of comparators that are each referenced to one of a plurality of reference voltages provided by the resistive network. The ADC compares the voltage amplitude of the analog input signal to the plurality of reference voltages to determine the reference voltage closest in value to that of the input signal.

In greater detail, and with reference to FIG. 1, the fundamental block level architecture of a typical flash ADC 1 includes a resistor ladder of resistors 10, each of which provides a reference voltage to one of a plurality of comparators 12 coupled to an encoder and error correction circuit 14. The resistor ladder is supplied with voltages $V_{ref+}$ and $V_{ref-}$ to create the quantization reference voltages. Each comparator compares the input signal 20 to its respective reference voltage and provides a signal $d_{1...N}$ to the encoder 14 indicative of the voltage of the input signal. The encoder then calculates the value of the input signal voltage based upon the signals $d_{1...N}$ received from all the comparators and outputs a digital signal D indicative of this value.

The first and last resistors 10 in the ladder typically have a resistance of R/2, which produces a first reference voltage at half the quantization stage. The other resistors have a resistance value of R, corresponding to a voltage representing one full quantization stage. The total number of resistors is therefore $2^n+1$, where n is the resolution of the ADC. Assuming a potential difference over the entire ladder of V, a total current of $I_{tot}$ will be flowing through the resistors, according to equation 2.

$$V = (V_{ref+} - V_{ref-}) \quad \text{(Eq. 1)}$$

$$I_{tot} = \frac{V}{(R \times 2^n)} \quad \text{(Eq. 2)}$$

Due to a leakage current $I_b$ at the input of each comparator 12, a bowing effect appears along the ladder that causes distortion in the integrity and equality of the quantization levels. As a result, the current through a resistor "m" is defined by equation 3.

$$I_m = \frac{V}{(R \times 2^n)} - m \times I_b \quad \text{(Eq. 3)}$$

To decrease the relative degree of the bowing, the resistivity of each resistor must be determined for the current drop-out and/or the input leakage current $I_b$ must be scaled. In addition, $I_{tot}/I_b$ must be high enough to allow an acceptable drop in the reference voltage when the comparator switches and the current gain of the input transistor drops. The degree of degradation increases as the sampling frequency is raised.

As the breakdown voltage in high-speed technologies keeps decreasing, the supply voltage is dropping as well. As a result, to increase the total current available, resistance values must be decreased. Thus, the physical size and the parasitics of the resistors are becoming significant variables in the determination of resistor value and tend to quickly become destructive, thereby causing a loss of resolution. Additionally, in current ADCs the interconnects carrying the reference voltages by necessity must cross the interconnect carrying the analog input signal, which causes further signal dependent distortion of the input to the comparator cells that degrades the dynamic characteristics of the converter. This effect is especially apparent in wide-band ADCs.

As evident from the above discussion, the resistors in the resistor ladder of an ADC should have very precise resistance values for the ADC to function properly and accurately. Resistance variations as low as 0.025 percent can compromise the linearity and accuracy of a 12-bit ADC. However, the standard semiconductor circuit manufacturing techniques used to manufacture ADCs often produce resistors with resistance mismatches of as much as 0.2 percent, necessitating further post-production processing. One technique well known in the art entails trimming the resistors with lasers to a precise resistance. This is currently not a financially viable method for producing high volume, medium-cost ADCs. Another approach known in the art to correct for ADC non-linearities is to store a table of correction values in a memory and use computer software to adjust each digital value output by the ADC with a corresponding correction value read from the stored table. This technique is not practicable when a microprocessor or microcontroller is not used in the particular application or system, or when the system lacks sufficient memory storage or microprocessor computation cycles to use this technique.

What is now needed is an improved, cost effective method for generating precise reference voltages for the comparators of an ADC. The embodiments disclosed herein address this and other needs.

SUMMARY

In a first embodiment disclosed herein, an ADC comprises a plurality of comparators, each comparator for comparing the voltage of an input electrical signal with a respective reference electrical signal having a pre-selected voltage, an encoder coupled to the comparators to receive a detection signal from each comparator indicative of the input signal voltage, and a plurality of reference circuits, each reference circuit coupled to a respective one of the plurality of comparators to supply the respective reference electrical signal to the comparator.

In another embodiment disclosed herein, a method for digitizing a signal comprises generating a plurality of reference electrical signals, each reference signal having a preselected voltage, supplying each reference electrical signal to a respective one of a plurality of comparators, supplying an input electrical signal to each one of the comparators to compare the input signal with the respective reference electrical signal, and providing a detection signal from each of the comparators to an encoder, the detection signal indicative of the input signal voltage.

In a further embodiment disclosed herein, a method for digitizing a signal comprises generating a plurality of reference electrical signals, each reference signal having a preselected voltage, supplying each one of the reference electrical signals to a respective one of a plurality of comparators, comparing an input electrical signal with the respective reference signal in each one of the comparators, and providing a signal from each of the comparators to an encoder, the signal indicative of the input signal voltage.

These and other features and advantages of this invention will become further apparent from the detailed description and accompanying figures that follow. In the figures and description, numerals indicate the various features of the invention, like numerals referring to like features throughout both the drawings and the description.

DETAILED DESCRIPTION

Figure 1:
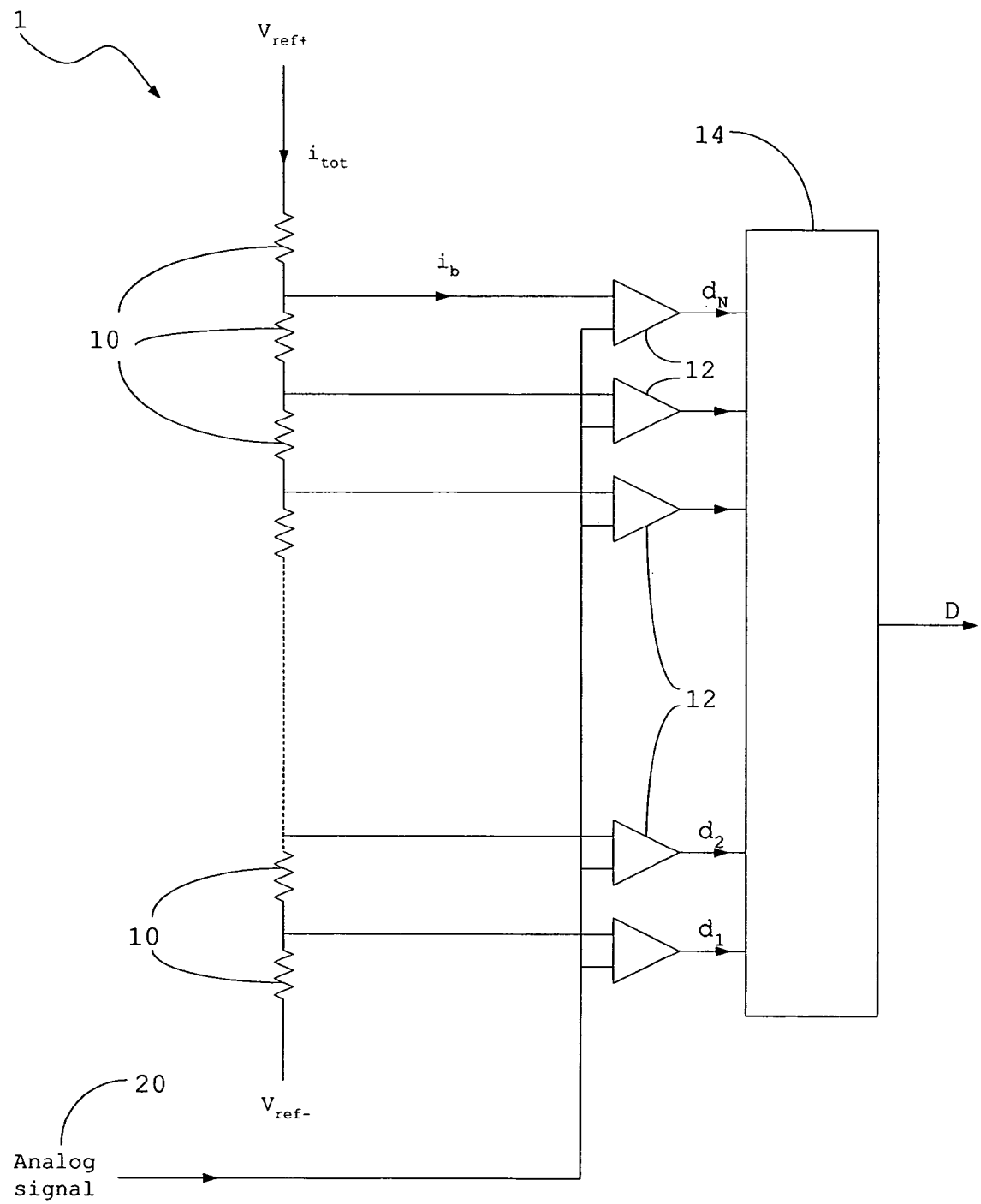
FIG. 1 is a functional block diagram illustrating a prior art design for providing a differential reference voltage for an ADC.
Figure 2:
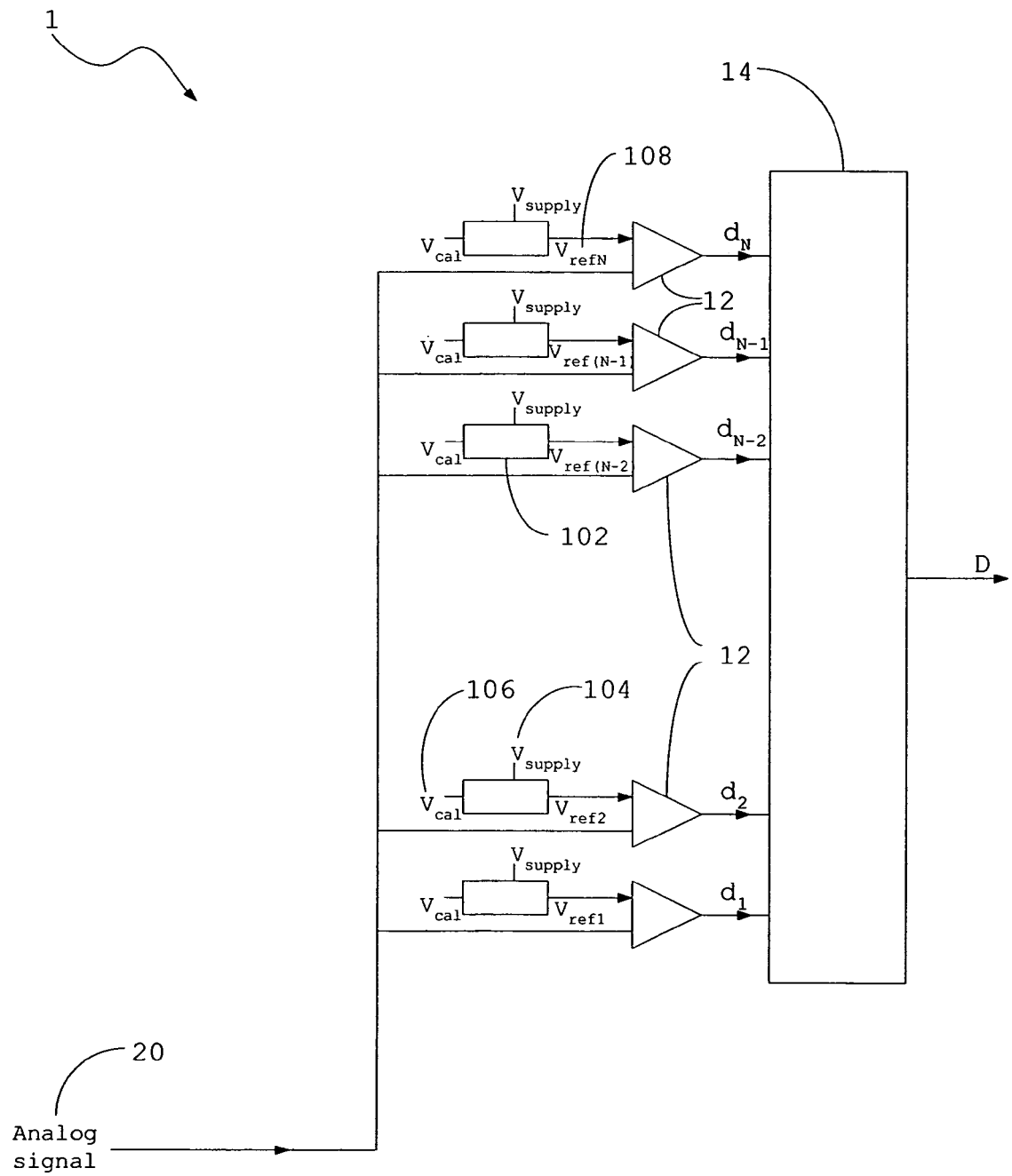
FIG. 2 is a functional block diagram illustrating a design for providing a differential reference voltage for an ADC according to an embodiment described herein.

Referring to FIG. 2, an embodiment of a flash ADC 1 includes N comparators 12, each connected to an encoder and error correction circuit 14. An analog signal 20 that is to be digitized is fed to each comparator 12. Each comparator includes a reference voltage generator 102, which for purposes of clarity of illustration only is shown as separate from the comparator. Each reference voltage generator 102 is supplied with a voltage $V_{supply}$ and, optionally, a calibration voltage $V_{cal}$ to generate a predetermined reference voltage $V_{ref}$, wherein the reference voltages $V_{ref1} \ldots V_N$ are stepped in value so as to create the required voltage reference ladder for the ADC 1. In this manner, the reference ladder generating circuit is distributed across the comparators of the ADC such that each comparator incorporates or cooperates with a reference voltage generator 102. An advantage of this design is that the analog signal 20 to be digitized does not cross the reference voltage input interconnects, thereby eliminating a significant source of signal distortion.

With continued reference to FIG. 2, each comparator compares the input signal 20 to its respective reference voltage $V_{ref1} \ldots V_N$ and provides a respective signal $d_1 \ldots d_N$ to the encoder 14 indicative of the voltage of the input signal. The encoder then calculates the value of the input signal voltage based upon the signals $d_1 \ldots d_N$ received from all the comparators and outputs a digital signal D indicative of this value.

Figure 3:
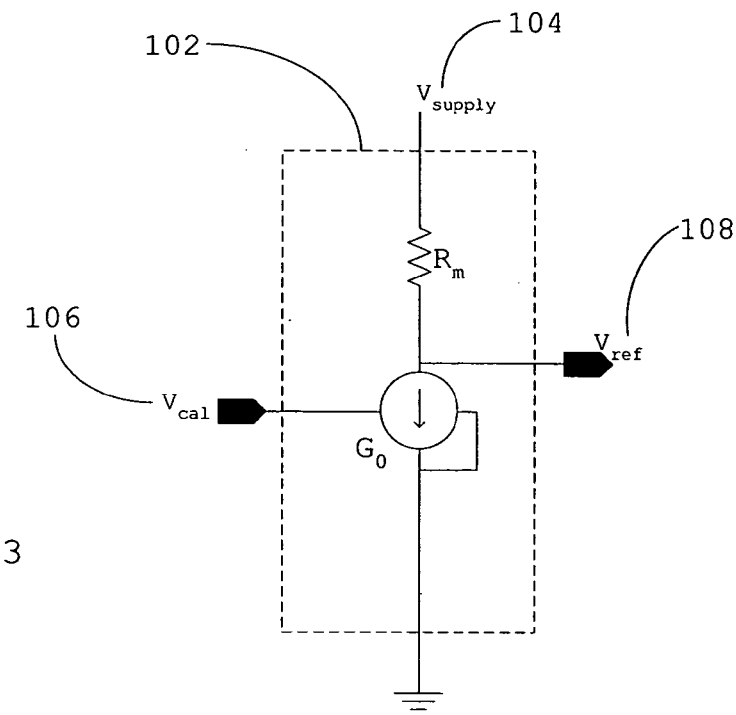
FIG. 3 is a schematic illustrating a circuit for providing a reference voltage to each comparator of an ADC according to the embodiment of FIG. 2.

Referring to FIG. 3, an embodiment of a reference voltage generator 102 includes a resistor $R_m$ to control the reference voltage output $V_{ref}$, and a voltage controlled current source $G_0$ that may optionally be calibrated by a controllable voltage $V_{cal}$. Depending upon the comparator's position in the ladder of comparators, the resistance value of the resistor $R_m$ is as given by equation 4, where m is an integer value between 0 and $2^n$ and n is the resolution of the ADC.

$$R_m = (m+0.5) \times R \quad \text{(Eq. 4)}$$

Figure 4:
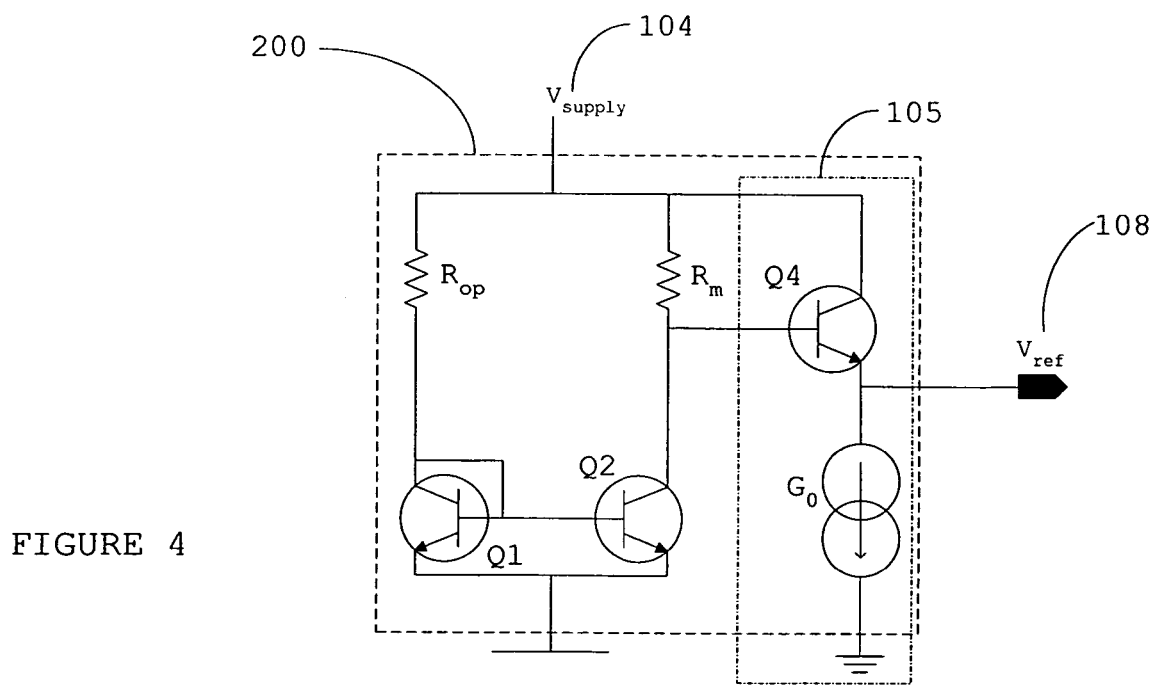
FIG. 4 is a schematic illustrating a circuit for implementing the embodiment of FIG. 3 at the transistor level in accordance with one embodiment described herein.

The ADC 1 will typically be implemented in an integrated circuit, and thus the reference voltage generators will be implemented at the transistor level. FIG. 4 illustrates one embodiment of a reference voltage generator 200 that utilizes resistor $R_m$ to control the operating voltage of n-channel output transistor Q4, which in turn generates the reference voltage 108 ($V_{ref}$). A current mirror consisting of resistor $R_{op}$ in series with n-channel transistor Q1 "copies" the current flowing through reference resistor $R_m$ to set the operation current of control transistor Q2 that is in series with $R_m$. As will be appreciated, the emitter follower circuit 105 represented by reference voltage generator 200 also provides a low impedance output that is required for high frequency operation. Those skilled in the art will recognize, however, that the emitter follower circuit 105 is optional and the output reference voltage $V_{ref}$ may be tapped directly off $R_m$. Thus, and as explained previously, changing the resistance value of resistor $R_m$ will change the output reference voltage $V_{ref}$ provided by n-channel output transistor Q4. As known to those skilled in the art, the output reference voltage $V_{ref}$ may also be changed by controlling the current in the circuit and varying the operating characteristics of the transistors.

Figure 5:
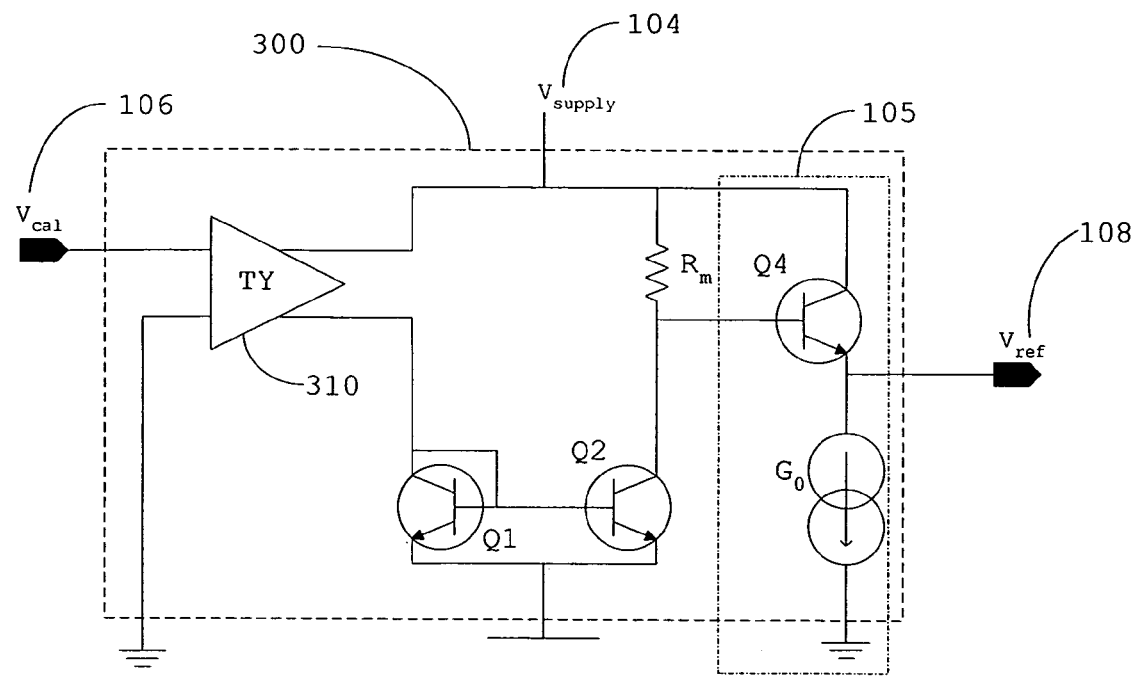
FIG. 5 is a schematic illustrating a circuit for implementing the embodiment of FIG. 3 at the transistor level in accordance with an alternative embodiment described herein.

Referring now to FIG. 5, in another embodiment of a reference voltage generator 300, the current mirror resistor $R_{op}$ of the embodiment of FIG. 4 is replaced with a transadmittance amplifier 310. Thus, as is well known in the art, instead of controlling the current through the current mirror with the resistor $R_{op}$ as in reference voltage generator 200, reference voltage generator 300 converts an input voltage 106 ($V_{cal}$) to a current. In this manner, by controlling the input voltage 106, the output reference voltage 108 may be varied across a desired range. As will be apparent, this arrangement therefore allows calibrating the output reference voltage 108 by adjusting the input voltage 106 rather than the resistance value of reference resistor $R_m$. Thus, by forming an ADC with a distributed reference ladder generation circuit using reference voltage generators 300 as disclosed herein, the ADC may be calibrated after production, and may even be adjusted to different sampling setpoints, simply by adjusting the input voltage 106 to each transadmittance amplifier 310. The same input voltage 106 may be provided to all trans-admittance amplifiers 310, or may be individually controlled for each trans-admittance amplifier of each comparator 12. In this embodiment, the emitter follower circuit 105 is also optional.

Figure 6:
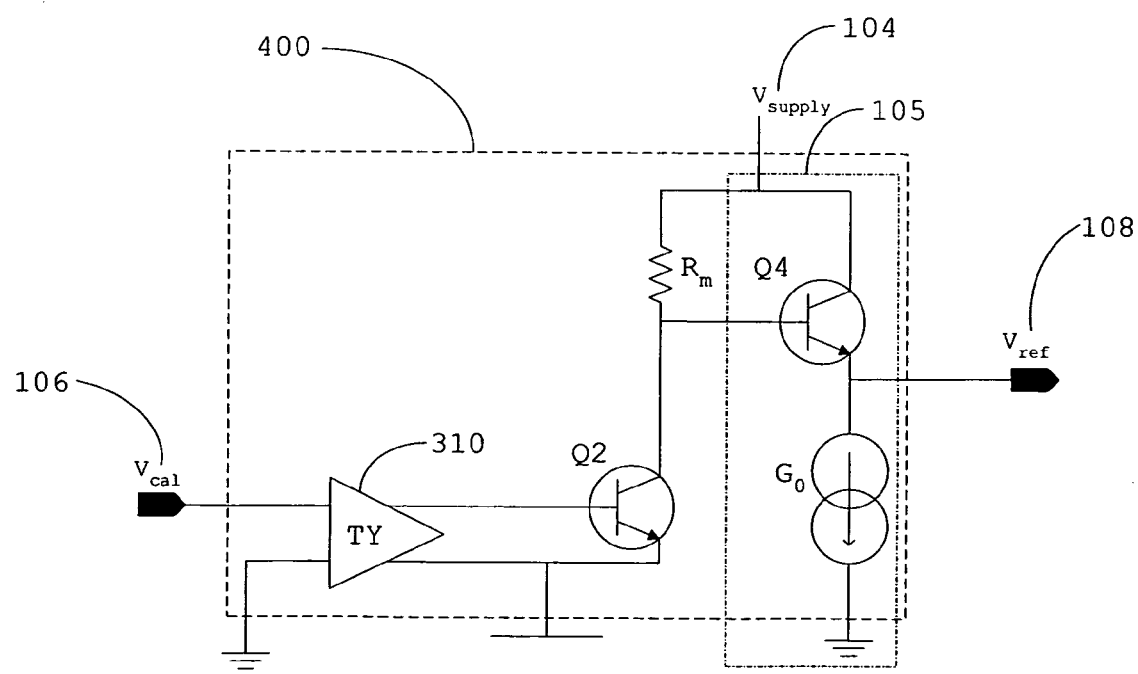
FIG. 6 is a schematic illustrating a circuit for implementing the embodiment of FIG. 3 at the transistor level in accordance with another alternative embodiment described herein.

The embodiment of FIG. 6 is a variation of the embodiment of FIG. 5. Reference voltage generator 400 is similar to reference voltage generator 300, but the trans-admittance amplifier 310 is connected directly to the base and emitter of control transistor Q2, thereby eliminating the current mirror. Thus, in this embodiment, input voltage 106 is referenced to the lowest supply voltage in the circuit (i.e. ground), while in reference voltage generator 300 the input voltage is referenced to the highest supply voltage in the circuit. By controlling the control transistor Q2 directly with the trans-admittance amplifier 310, any non-linearities that may be introduced by the current mirror are avoided. However, the performance constraints imposed upon the trans-admittance amplifier 310 when used in reference voltage generator 400 are correspondingly more stringent because the base current of control transistor Q2 will typically be very low, and therefore the output impedance of the trans-admittance amplifier will need to be low. This approach may therefore be found to be preferable in implementations where the same input voltage 106 is applied to all trans-admittance amplifiers 310, thereby adjusting all comparators 12 together and in equal increments. As in the previous embodiments, the emitter follower circuit 105 is optional.

Thus, as will be appreciated, the embodiments of FIGS. 4, 5 and 6 are immune to the bowing effect described elsewhere herein. Furthermore, the operating point of the the control transistor Q2 and reference resistor $R_m$ may be defined with a degree of freedom that is not afforded by classical ADC designs. As a result, the physical size of the resistors may be chosen in accordance with the best solutions afforded by technology and the magnitude of the current defined by control transistor Q2.

Figure 7:
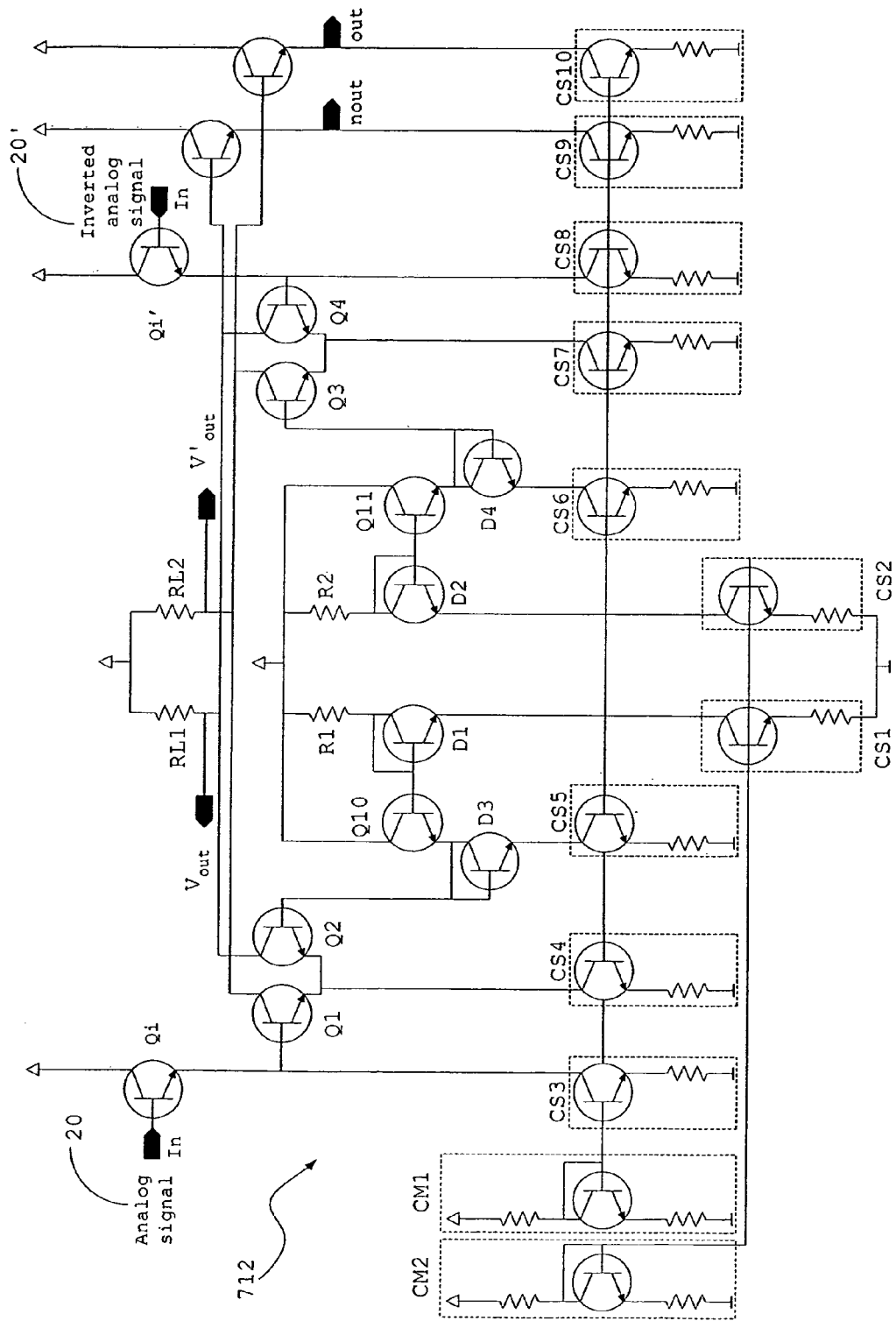
FIG. 7 is a schematic illustrating a circuit for a dual differential comparator cell utilizing differential distributed resistor ladders according to an embodiment described herein.

In another embodiment, the comparator may be implemented in a fully differential circuit utilizing the reference voltage generators disclosed herein. For example, FIG. 7 illustrates one possible circuit for a dual differential comparator 712, wherein the comparator compares the input analog signal 20 with reference voltage $R_m$ and simultaneously compares the inverted analog input signal 20' to reference voltage $R_{N-m}$, then sums the result of the two comparisons and provides a high logical output when the value of the analog input signal is less than the reference voltage created by $R_m$ and the value of the inverted analog input signal is higher than the reference voltage created by $R_{N-m}$. Output voltages $V_{out}$, $V'_{out}$ represent the resulting outputs of the circuit 712 in a complementary form.

With continued reference to FIG. 7, and with greater specificity, R1 and R2 represent the reference resistor $R_m$ and its differential counterpart, respectively. The analog signal 20 to be digitized is provided to the comparator at the base of n-channel input transistor Qi and is also provided in inverted form 20' to the base of the differential counterpart of Qi, n-channel input transistor Qi'. Both Qi and Qi' are input elements of emitter followers that decrease the load connected to the analog differential inputs of the comparator 712 and thereby improve the input impedance of the comparator. The emitter followers drive the inputs Q1, Q4 of two differential stages consisting of transistors Q1–Q2 and Q3–Q4, respectively.

With continued reference to FIG. 7, in an N-bit ADC, resistors R1 and R2 will have resistance values corresponding to the distributed resistor ladder values $R_m$ and $R_{N-m}$. Resistors R1 and R2 create the reference voltage to the double differential comparator cell as shown in FIG. 7. The current through resistors R1 and R2 is controlled by current sources CS1 and CS2, respectively, which in turn are controlled by current mirror CM2. The resistors R1 and R2 are connected to the current sources CS1, CS2 through transistors D1 and D2, respectively, which are configured in diode formation (i.e. the base and collector are shorted). The diodes that short the base and collector fulfill the function of level shifting, among others, to thereby protect the current source transistors from breakdown.

The reference voltages thus produced are supplied to the base of transistors Q10 and Q11, which are inputs to emitter followers provided with protection diodes D3, D4. The emitter followers partly introduce an isolation between the differential stages consisting of transistors Q1 through Q4, and partly correct the reference voltage for the base-emitter voltage diode drop to which the analog input signal 20, 20' is exposed to through the input emitter followers. In one embodiment, a current mirror CM1 may be used to control the current sources CS3 through CS10 for the emitter followers and the differential stages. The two differential stages created by transistors Q1, Q2 and Q3, Q4 respectively share their resistor loads RL1 and RL2. The resistance values of the resistors RL1 and RL2 are selected so that swings in the output voltages $V_{out}$, $V'_{out}$ comply with logical levels.

Figure 8:
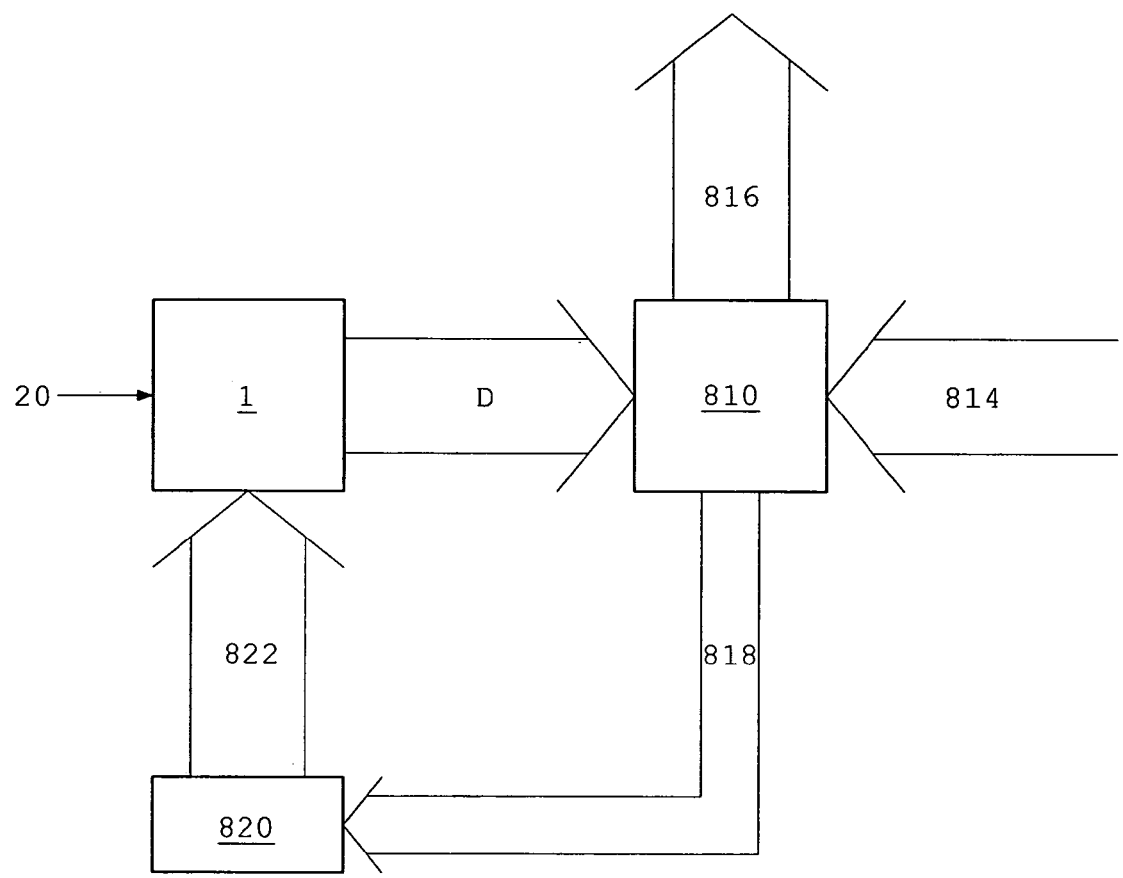
FIG. 8 is functional block diagram illustrating a reprogrammable ADC according to an embodiment described herein.

An ADC incorporating any of the embodiments described herein may be used in numerous implementations. FIG. 8 is a system level block diagram illustrating an embodiment of an ADC as disclosed herein implemented within a system. ADC 1 receives analog electrical signal 20 to digitize it, and outputs digital signal D indicative of the value of the analog signal 20, as discussed elsewhere herein. Digital signal D is provided to a digital signal processor (DSP) 810 to process as required by the system and output digital data signal 816 for use by the system.

In a method of calibrating the ADC 1, the analog signal 20 may consist of a set of preselected, known test signals that the ADC will digitize and provide as signal D to the DSP 810. The DSP 810 may then compare the digitized signal D with data 814 representative of the known analog signal 20, which may be externally provided and/or stored internally in the DSP, and provide digital calibration data 818 that is indicative of the error between digitized signal D and know analog input signal 20. Digital calibration data may be provided to a digital-to-analog converter (DAC) array 820 to convert the digital calibration data to analog recalibration data 822 for adjusting the input voltage 106 being provided to the trans-admittance amplifiers 310 of the comparators 12 of the ADC 1, as discussed elsewhere herein. Adjusting the input voltage 106 will affect the performance of the ADC and impact accordingly the digital signal D being provided to the DSP, which in turn will once again compare the digital signal D with data 814. In this manner a feedback loop may be established to quickly and automatically calibrate the ADC 1. A plurality of test signals 20 may be provided to test and calibrate the ADC over a desired range of performance. The calibration procedure may be repeated as desired, at predetermined intervals or as may be deemed necessary based upon system performance. In this manner, a system incorporating an ADC as disclosed herein may be provided with the capability to monitor and recalibrate itself, thereby providing enhanced performance and reliability. In other embodiments, the DSP 810 may provide the digital calibration data 818 to a digital adaptive filter or similar circuit for post-processing the digital signal D provided by the ADC 1 during operation of the system.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

What is claimed is:

1. An analog to digital converter, comprising:
   a plurality of comparators, each comparator for comparing an input electrical signal with a respective, pre-selected reference electrical signal, each comparator comprising a comparator for comparing a voltage of the input electrical signal with a voltage of the respective reference electrical signal, the respective reference electrical signal having a pre-selected voltage;
   an encoder coupled to the comparators to receive a detection signal from each comparator indicative of a voltage of the input signal; and
   a plurality of reference circuits, each reference circuit coupled to a respective one of the plurality of comparators to supply the respective reference electrical signal to the respective comparator, each reference circuit comprising
      an output transistor to provide the reference electrical signal;
      a current source coupled between an emitter of the output transistor and ground;
      a reference resistor coupled to a base of the output transistor to set an operation current of the output transistor;
      a control transistor coupled to the reference resistor in parallel with the output transistor to allow current flow through the reference resistor; and
      a current mirror coupled in parallel with the reference resistor and control transistor to control the current flowing through the reference resistor.

2. The analog to digital converter of claim 1, wherein the current mirror comprises:
   a resistor coupled in series with a transistor.

3. The analog to digital converter of claim 1, wherein each reference circuit comprises:
   an emitter follower circuit.

4. The analog to digital converter of claim 1, wherein the current mirror comprises:
   a trans-admittance amplifier coupled in series with a transistor.

5. The analog to digital converter of claim 1, wherein each reference circuit comprises:
   an output transistor to provide the reference electrical signal;
   a current source coupled between an emitter of the output transistor and ground;
   a reference resistor coupled to a base of the output transistor to set an operation current of the output transistor;
   a control transistor coupled to the reference resistor in parallel with the output transistor to allow current flow through the reference resistor; and
   a trans-admittance amplifier coupled to the base of the control transistor to control the current flowing through the reference resistor.

6. A method for digitizing an analog signal, comprising:
   generating a plurality of predetermined reference electrical signals by applying a supply voltage to each of a plurality of reference circuits, each reference circuit comprising an output transistor to provide the reference electrical signal, a current source coupled between an emitter of the output transistor and ground, a reference resistor coupled to a base of the output transistor to set an operation current of the output transistor, a control transistor coupled to the reference resistor in parallel with the output transistor to allow current flow through the reference resistor, and a current mirror coupled in parallel with the reference resistor and control transistor to control the current through the reference resistor, the current mirror comprising a trans-admittance amplifier coupled in series with a transistor, and applying a preselected control current to each trans-admittance amplifier to control the current flowing through the respective reference resistor to cause the respective output transistor to provide the respective reference electrical signal at a respective preselected voltage;
   supplying each reference electrical signal to a respective one of a plurality of comparators;
   supplying an input electrical signal to each one of the comparators to compare the input electrical signal with the respective reference electrical signal and to provide a detection signal indicative of a voltage of the input electrical signal; and
   providing each detection signal from each comparator to an encoder arranged to output a signal indicative of a magnitude of the input electrical signal.

7. Method for digitizing an analog signal, comprising:
   generating a plurality of predetermined reference electrical signals by applying the supply voltage to each of a plurality of reference circuits, each reference circuit comprising an output transistor to provide the reference electrical signal, a current source coupled between an emitter of the output transistor and ground, a reference resistor coupled to a base of the output transistor to set an operation current of the output transistor, a control transistor coupled to the reference resistor in parallel with the output transistor to allow current flow through the reference resistor, and a trans-admittance amplifier coupled to the base of the control transistor to control the current through the reference resistor, and applying a preselected control current to each trans-admittance amplifier to control the current flowing through the respective reference resistor to cause the respective output transistor to provide the respective reference electrical signal at a respective preselected voltage;
   supplying each reference electrical signal to a respective one of a plurality of comparators;
   supplying an input electrical signal to each one of the comparators to compare the input electrical signal with the respective reference electrical signal and to provide a detection signal indicative of a voltage of the input electrical signal; and
   providing each detection signal from each comparator to an encoder arranged to output a signal indicative of a magnitude of the input electrical signal.

* * * * *